United States Patent [19]
Levy et al.

[11] Patent Number: 5,369,431
[45] Date of Patent: Nov. 29, 1994

[54] VERIFICATION AND REPAIR STATION OF PCBS

[75] Inventors: Haviv Levy, Rishon Lezion; Israel Altman, Kiryat Ono, both of Israel

[73] Assignee: Orbotech, Yavne, Israel

[21] Appl. No.: 21,769

[22] Filed: Feb. 24, 1993

[30] Foreign Application Priority Data

Feb. 25, 1992 [IL] Israel .................... 101063

[51] Int. Cl.⁵ .................... H04N 7/18
[52] U.S. Cl. .................... 348/126; 248/79
[58] Field of Search ............... 358/106, 909; 359/394, 359/392, 385, 389, 393; 348/79, 80, 125, 126

[56] References Cited

U.S. PATENT DOCUMENTS

| | | | |
|---|---|---|---|
| 3,798,449 | 3/1974 | Reinheimer et al. | 359/392 |
| 4,230,940 | 10/1980 | Minami et al. | 250/201 |
| 4,236,781 | 12/1980 | Arimura | 359/385 |
| 4,367,915 | 1/1983 | Georges | 359/393 |
| 4,627,009 | 12/1986 | Holmes et al. | 359/393 |
| 4,836,667 | 6/1989 | Ozeki | 359/389 |
| 4,979,034 | 12/1990 | Funaki | 358/909 |
| 5,077,620 | 12/1991 | Mauro | 359/393 |
| 5,134,575 | 7/1992 | Takagi | 358/106 |
| 5,161,202 | 11/1992 | Kitakado et al. | 348/126 |
| 5,194,948 | 3/1993 | L'Esperance III et al. | 358/106 |

Primary Examiner—Tommy P. Chin
Assistant Examiner—Emil P. Lenchak
Attorney, Agent, or Firm—Leonard Bloom

[57] ABSTRACT

A verification and repair station for examining a printed circuit board (PCB) at a plurality of predetermined co-ordinates thereon for enabling an operator to classify suspected faults and to effect manual repair thereof if necessary. A worktable is provided for securing thereon the PCB in precise registration with an origin of the worktable and a fixed camera produces a magnified image of an illuminated area of the PCB. The co-ordinates are stored in a memory of a computer whilst a translatory drive is coupled to the worktable and to the computer for moving the worktable under control of the computer through mutually orthogonal axes so that successive co-ordinates are aligned with the camera. A visual display monitor coupled to the computer and to the camera for displays the magnified image of the illuminated area of the PCB and the computer is programmed to generate a drive signal in respect of any one of the co-ordinates which lies in a half of the worktable remote from the operator prior to its being aligned with the camera. A rotary drive coupled to the worktable and to the computer is responsive to the drive signal for rotating the worktable through 180°.

11 Claims, 8 Drawing Sheets

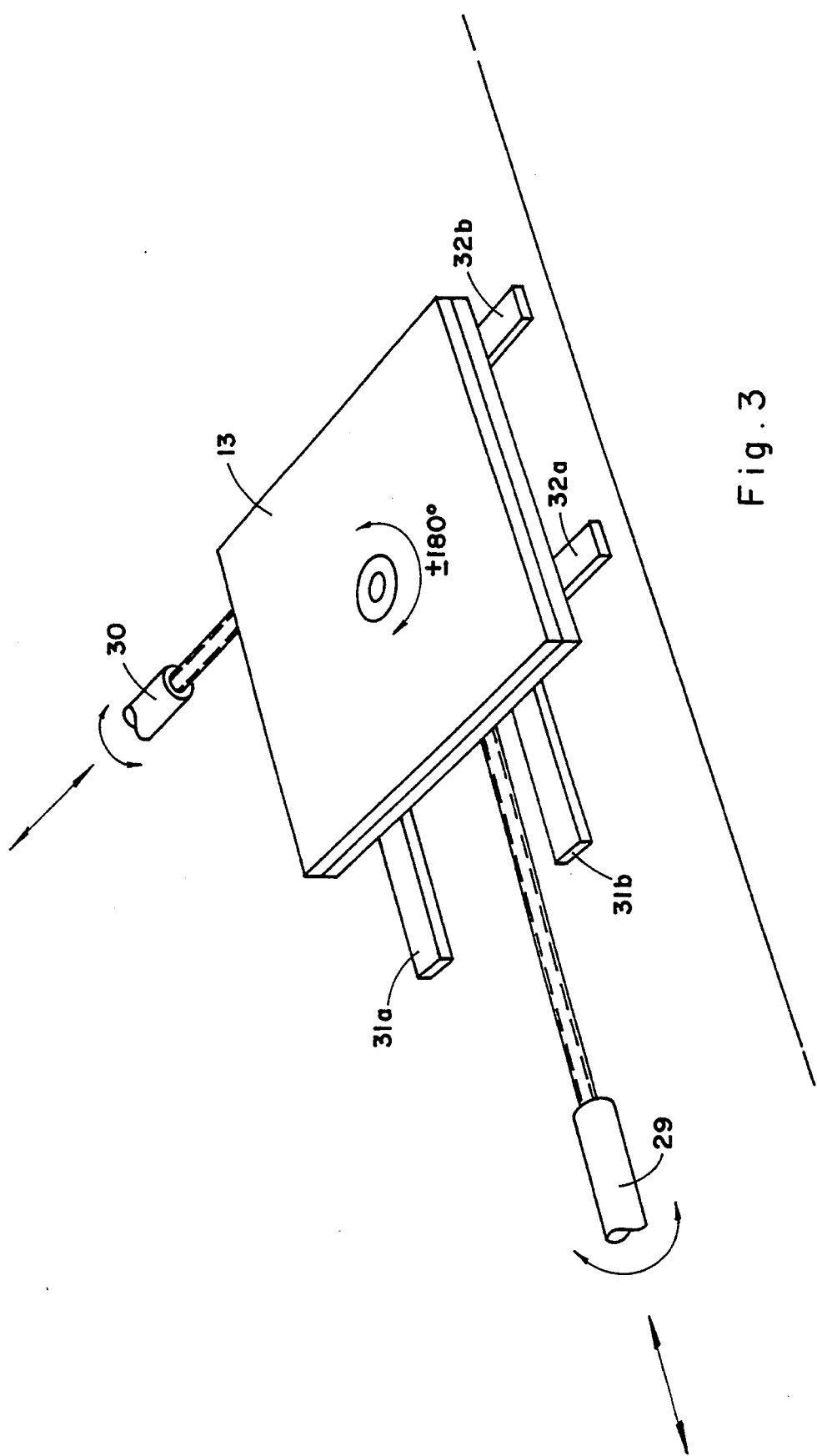

VERIFICATION AND REPAIR STATION OF PCBS

FIELD OF THE INVENTION

This invention relates to a verification and repair station for examining and repairing a printed circuit board.

BACKGROUND OF THE INVENTION

Automatic optical inspection (AOI) systems are commonly used nowadays in order to inspect bare printed circuit boards (PCB) for possible manufacturing defects or flaws, wherein the pcb layout is inspected in accordance with pre-determined design rules. Although the identification of such flaws is amenable to computerized inspection and analysis, a human operator is the final arbiter as to whether the suspected fault is in fact a flaw or not. Furthermore, as is well known, suspected flaws fall into three categories: there are those which, on closer examination, turn out to be false alarms; there are those which are genuine faults but are nevertheless susceptible to minor repair and there are those faults which are irreparable.

A printed circuit board with an irreparable fault is not susceptible to repair and must therefore be discarded. Clearly, no further act/on need be taken in respect of those suspected flaws which, on closer examination, turn out to be false alarms. So far as the second category is concerned, namely those faults which are susceptible to minor repair, it is known to dispatch the printed circuit board to a verification and repair station remote from the AOI system for subsequent repair. Although, obviously, it is possible to effect such repair at the AOI station itself, there are good reasons for not doing so. Specifically, the automatic optical inspection is very fast compared with any subsequent manual repair operation and thus to effect tile repairs at the AOI station itself would create a bottleneck and reduce the throughput and hence efficiency of the AOI station. Furthermore, very often suspected faults turn out, on closer analysis, to be false alarms. It would thus be a waste of time and resources to devote the required effort at the AOI station itself to differentiating between false alarms and genuine but repairable faults.

In order to effect tile required interconnection between the AOI station and tile verification and repair station, the AOI station produces a computer file containing therein a list of coordinates corresponding to the suspected fault locations on the PCB. These coordinates are then scanned sequentially at the verification and repair station so as to be successively imaged by a high magnification camera so that each suspected fault, in turn, may be displayed on a visual display monitor at very high magnification, enabling an operator to determine to which of the three above-mentioned categories the suspected fault belongs and, where relevant, whether it is susceptible to repair.

In such a system a repairable fault is repaired in situ, the operator effecting the repair whilst viewing the high magnification image on the display monitor.

Systems of the kind described are known in both the scientific and patent literature. Thus, for example, the general concepts are disclosed in U.S. Pat. No. 4,758,888 (Lapidot) which discloses a method and system for inspecting workpieces ravelling along a production line, wherein possible flaws are detected at an upstream inspection station without interrupting the progression of workpieces along the production line. Possible flaws are imaged and stored in a memory so as to be associated with the workpiece containing the possible flaw and the stored image is subsequently retrieved to enable verification, by visual inspection, as to whether the possible flaw is valid or not. On this basis, the workpieces are subsequently sorted into satisfactory and defective workpieces, the latter being diverted to a repair or scrape process for subsequent rework where possible.

A similar system is described in the IBM Technical disclosure Bulletin Volume 29 No. 3, August, 1986 pp 1154–1155 in an article entitled "Paperless system for inspection and rework of circuit boards". The system described therein is directed to circuit boards containing actual circuit components rather than to the bare PCB. Furthermore, the inspection record is created from a manual inspection of the board populated with components which also, of course, is a fundamental departure from AOI systems wherein such inspection is, in effect, performed automatically. Nevertheless, the article does disclose the concept whereby the results of the inspection are stored in association with an identification of the board for later recall during any necessary rework of the board.

European Patent Application No. 386 924 (Peles) discloses a work station for orientation of a workpiece, comprising a substantially plane mounting table for mounting the workpiece thereon. Typically, the workpiece is a PCB, predetermined suspected fault locations of which are imaged by a fixed camera by moving the mounting table until the predetermined fault location is aligned with the fixed camera. Such alignment is achieved by a single rotation of the table and a single translation thereof both within the plane of the table. In the opening section of European Patent Application No. 386 924, reference is made to prior art verification and rework stations wherein the desired alignment between the suspected fault location and the fixed camera is achieved by two mutually orthogonal translatory movements within the plane of the table. As is explained in European Patent Application No. 386 924, such verification stations have a large "footprint" requiring a large floor space since, with XY-movement of the table, the net area required for checking a square printed circuit board with a side L is $4L^2$. Furthermore, as the table is moved towards the operator in order to align a desired fault location with the illumination system, this inevitably increases the distance of the operator from the fault location. By effecting the desired alignment with a single rotation and a single translation, the required footprint is apparently reduced by up to about 25%. However, no solution is provided to the associated increase in operator distance from the fault location.

FIGS. 5, 6 and 7 of the above-mentioned European patent application show schematically how the system operates. It will be clear particularly from FIGS. 6 and 7 that when the fault location is aligned with the camera, a corner of the table protrudes towards the operator and the edge of the table is consequently no longer parallel to an imaginary line joining the center of the table to the camera. The amount by which the corner of the table thus protrudes is unpredictable and depends on where on the workpiece a particular fault location is situated. As a result, if the table is orientated substantially horizontally, either the operator must sit sufficiently far away from the table so as to accommodate maximal protrusion of the corner of the table as the table rotates about its axis or, alternatively, the operator must be free to move to and fro in order to accommodate the table's rotation.

Correspondingly, if the work table is orientated at an angle to the horizontal as is shown in FIG. 4 of the European patent application, then the work table must be situated sufficiently high relative to the operator's legs in order that maximal protrusion of the corner of the table can never foul the operator's legs.

In either case, these considerations militate somewhat against the requirement to reduce the footprint of the work table and thus demand that a greater area be allocated to the table's movement than is desirable.

Apart from considerations of space, there exist other drawbacks associated with verification and repair stations which have not been addressed in the prior art. It is well known, for example, that as the magnification of an optical system increases, so too does its depth of field diminish. This is highly significant in verification and repair stations of the kind described since the magnification required is so high that any slight distortion in the upper surface of the PCB being imaged can quite easily result in part of that surface being out of focus even when the PCB surface is nominally in focus. This would not happen if the surface of the PCB were exactly flat, since steps could then be taken to ensure precise and uniform focus over the entire imaged area. However, in practice, buckling is difficult to prevent and the problem of imprecise focus therefore exists.

Yet a further consideration is the manner in which the PCB surface is illuminated. In practice, two different sources of illumination are required: one directed from above in order to illuminate the upper surface of the PCB; and one directed from below so as to pass through feed-through holes or vias in the PCB in order that they too can be inspected and, if necessary, repaired.

Directing the illumination from above normally requires that a bright light source is directed over a small area of the PCB in order to illuminate the conductive tracks thereon. Since the conductive tracks themselves are generally highly polished, the light can be reflected thereby and generate flare which reduces the quality of the resulting image.

The manner in which the camera is focused is also an important feature of such verification and repair stations. It is possible to rely on a completely manual focusing system controlled by the operator but this, of course, is relatively time-consuming. Auto-focus systems are commonly used nowadays and their application to verification and repair stations of the kind described is clearly, in itself, merely a matter of design rather than of invention. However, it must be appreciated that whilst the use of auto-focus systems can increase the speed with which the camera is focused, it cannot compensate for buckling or other surface distortions of the PCB which render uniform focusing impossible.

BRIEF SUMMARY OF THE INVENTION

It is an object of the invention to provide a verification and repair station for examining a PCB in which the drawbacks associated with hitherto proposed systems are substantially reduced or eliminated.

According to the invention there is provided a verification and repair station for examining a printed circuit board (PCB) at a plurality of predetermined co-ordinates thereon for enabling an operator to classify suspected faults at said predetermined co-ordinates and to effect manual repair thereof if necessary, said verification and repair station comprising:

a worktable having means for securing thereon the PCB in precise registration with an origin of the worktable, a fixed camera for producing a magnified image of an area of the PCB, illumination means for illuminating said area of the PCB, a computer having a memory for storing said predetermined coordinates, translatory drive means coupled to the worktable and to the computer for moving the worktable under control of the computer through mutually orthogonal axes so that successive ones of said predetermined co-ordinates are aligned with the camera, a visual display monitor coupled to the computer and to the camera for displaying the magnified image of said area of the PCB, logic means associated with the computer for generating a drive signal in respect of any one of said predetermined co-ordinates which lies in a half of the worktable remote from the operator prior to its being aligned with the camera, and a rotary drive means coupled to the worktable and to the logic means and responsive to said drive signal for rotating the worktable through 180°.

Thus, in the verification and repair station according to the invention logic is provided for determining whether the suspected fault location lies in that half of the worktable remote from the operator, in which case the whole of the worktable is rotated through 180° prior to the fault location being aligned with the camera. By this means the footprint of the system is reduced and the operator is permitted closer access both to the worktable and to the fault location.

Further advantages of the proposed system will become apparent from the detailed description of a preferred embodiment which now follows.

BRIEF DESCRIPTION OF THE DRAWINGS

In order to understand the invention and to see how the same may be carried out in practice, a preferred embodiment will now be described, by way of non-limiting example only, with reference to the accompanying drawings, in which;

FIG. 3 shows schematically translatory drive means for effecting the required translatory movements of the worktable shown in FIGS. 1 and 2;

FIGS. 4 and 5 are schematic representations useful in explaining a principal operating feature of the invention, and wherein FIG. 4 shows schematically a rotary drive means for effecting the required rotary movements of the worktable 13;

DETAILED DESCRIPTION OF A PREFERRED EMBODIMENT

Figure 1:
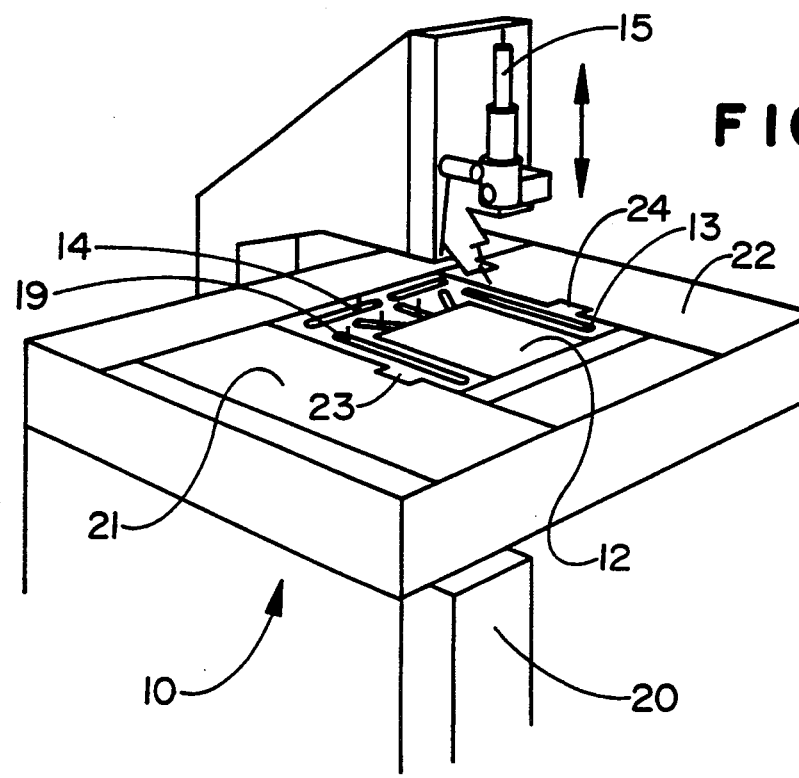
FIGS. 1 and 2 are pictorial representations showing the system according to the invention.
Figure 2:
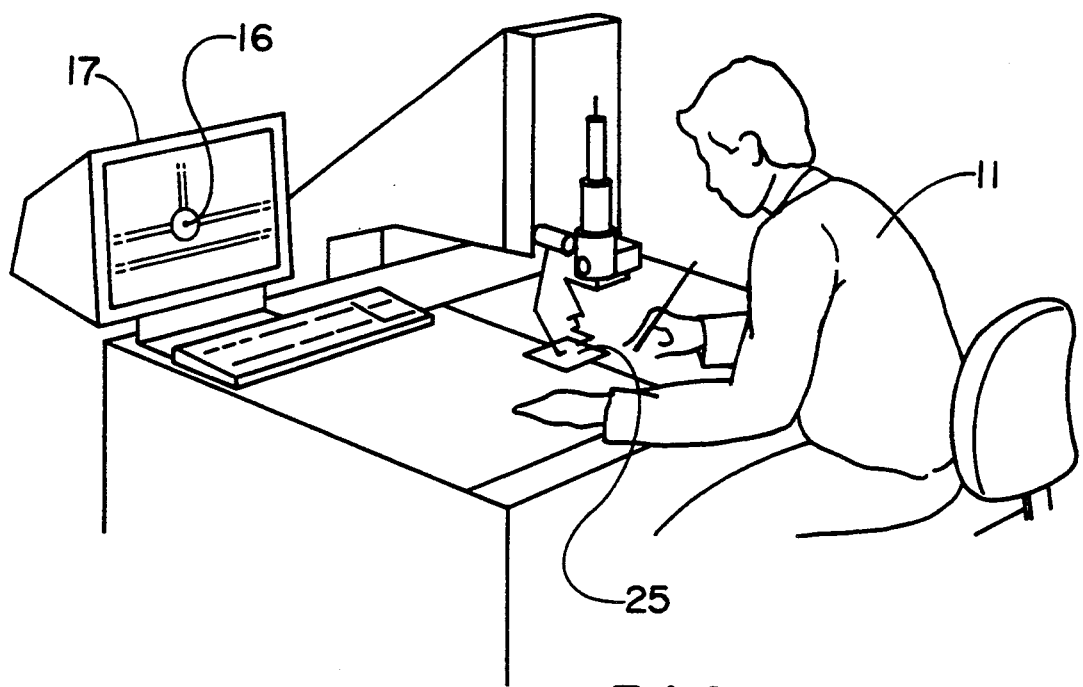
Figure 4:
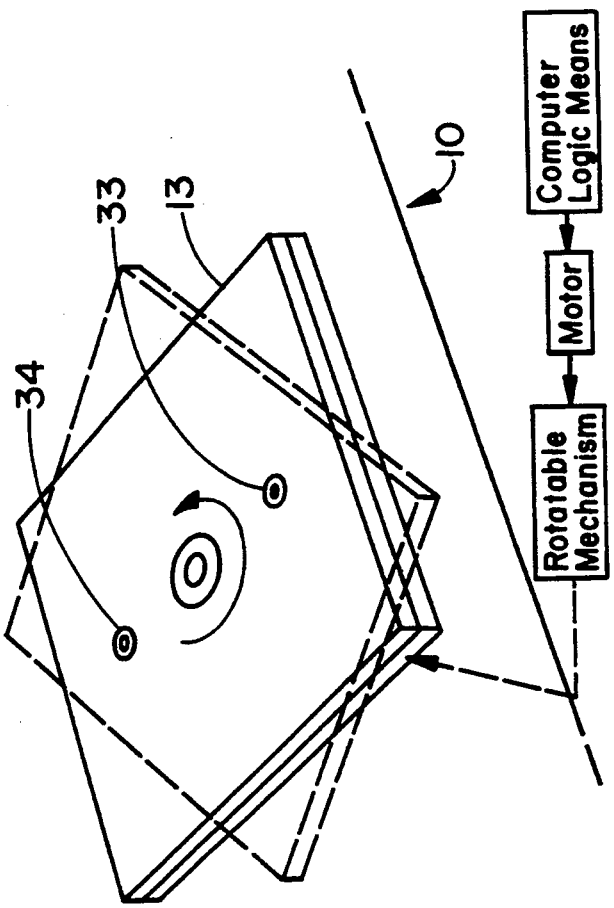

Referring to FIGS. 1 and 2 there is shown a verification and repair station depicted generally as 10 permitting an operator 11 to effect manual repair to a printed circuit board 12 conventionally secured to a worktable 13 (for example, as disclosed on page 3, column 3, lines 50–57, and illustrated in FIG. 4 of the above-mentioned European Patent Application). As in the European Patent Application, the worktable 13 may be, as illustrated, provided with a number of T-slots 14 into which are inserted, and tightened fast, a number of locating pins 19 smoothly fitting pre-drilled holes in the PCB.

The system comprises a fixed camera 15 for producing a magnified image 16 of an area of the PCB 12 and a visual display monitor 17 for displaying the magnified image 16.

A computer 20 typically located underneath the worktable 13 stores within its memory predetermined co-ordinates corresponding to suspected fault locations identified by an automatic optical inspection (AOI) system (not shown).

A pair of sliding covers 21 and 22 are also provided, each having respective complementary recesses 23 and 24 which close in order to provide a small operating window 25 between the adjoining recesses 23 and 24 and which contains the area of the PCB 12 displayed on the display monitor 17, thereby permitting the operator 11 to effect delicate repair work within the operating window 25 whilst avoiding inadvertent contact with any other part of the PCB 12.

The camera 15 is not located centrally with respect to the worktable 13 but, rather, is disposed towards the operator 11 in order that the operator 11 will be comfortably close to the area of the PCB 12 within the operating window 25. This obviates the need for the operator 11 to stretch over the PCB 12 thereby rendering the system more comfortable and reducing operator fatigue.

FIG. 3 shows schematically how a predetermined fault location on the PCB 12 may be aligned precisely with the camera 15 by effecting the required movements to the worktable 13 on which the PCB 12 is secured. Thus, in the case of the suspected fault's location being in that half of the worktable 13 remote from the operator 11, the logic means associated with the computer 20 generates a drive signal in respect of the predetermined co-ordinate of the suspected fault, and the worktable 13 is rotated through 180° in response to said drive signal. Rotation of the worktable through a desired angle in response to a corresponding drive signal is described, for example, in the above-mentioned European Patent Application with reference to FIG. 4 thereof. However, no suggestion is made in the European Patent Application to rotate the worktable through 180° in order to achieve the object of the present invention. Furthermore, there is provided a pair of orthogonal threaded rods 29 and 30 which engage complementary threaded bosses fixed to the worktable 13, whereby rotation of the threaded rods 29 and 30 effects corresponding translatory movement of the worktable 13 along corresponding parallel tracks 31a, 31b and 32a, 32b, respectively. The threaded rods 29 and 30 constitute translatory drive means for effecting the required translatory movements of the table 13 so that any point on the PCB 12 secured thereon may be aligned with the camera 15. Such translatory drive means are well known in the art and are described, for example, in U.S. Pat. No. 4,896,869 (Takekoshi).

Referring to FIG. 4 of the drawings, the worktable 13 is shown in a first stage of operation whereby a fault location 33 is aligned with the camera (not shown) which is located above the near half of the table 13 towards the edge of the verification and repair station 10 at which the operator sits. When it is desired to image a point 34 on that half of the worktable 13 remote from the operator, the table 13 is rotated through 180°, as shown in dotted outline.

Figure 5:
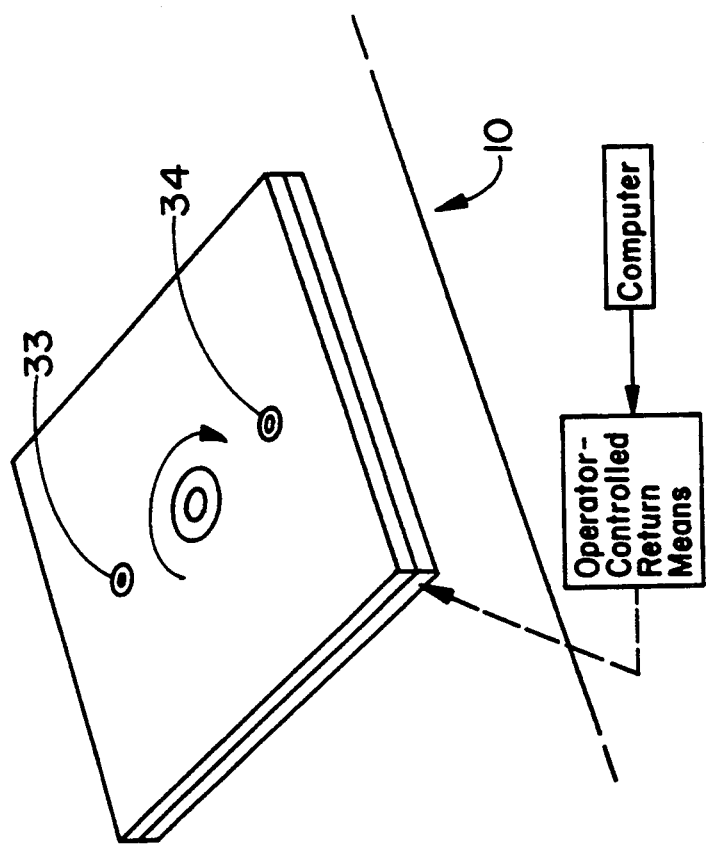

FIG. 5 shows the situation after the table 13 has been thus rotated, wherein the fault location 34 is now on that part of the table closest to the operator. Subsequent translatory movements are now applied to the worktable 13, as required, until the fault location 34 is exactly aligned with the camera 15.

Preferably, the visual display 17 stores the magnified image 16 displayed thereon during movement of the worktable 13. Only when the camera 15 is aligned with the next fault co-ordinate, is the image 16 displayed by the display monitor 17 refreshed. By this means, the actual movement of the worktable 13 is not displayed, thus reducing operator fatigue.

Furthermore, the slight delay in refreshing the display monitor 17 between successive co-ordinates gives the operator slightly more time to assess and classify each suspected flaw in order to decide whether remedial action is required. Referring to FIG. 5 of the drawings, in the event that the operator classifies the displayed flaw as requiring repair, the worktable 13 can be restored to its previous location by means of an operator controlled return means coupled to the computer 20. The slight increase in time thus achieved is valuable and even though it is counteracted by the need to restore the worktable 13 to its previous location in the event that the operator classifies the displayed flaw as requiring repair, it will be appreciated that, in practice, only a small proportion of suspected faults actually do require manual repair. Statistically, therefore, there will be relatively few occasions when it is necessary to restore the worktable 13 to a previous location compared to the actual number of suspected fault locations. As a result, the cumulative saving in time to progress through all the fault locations is significant.

Figure 6:
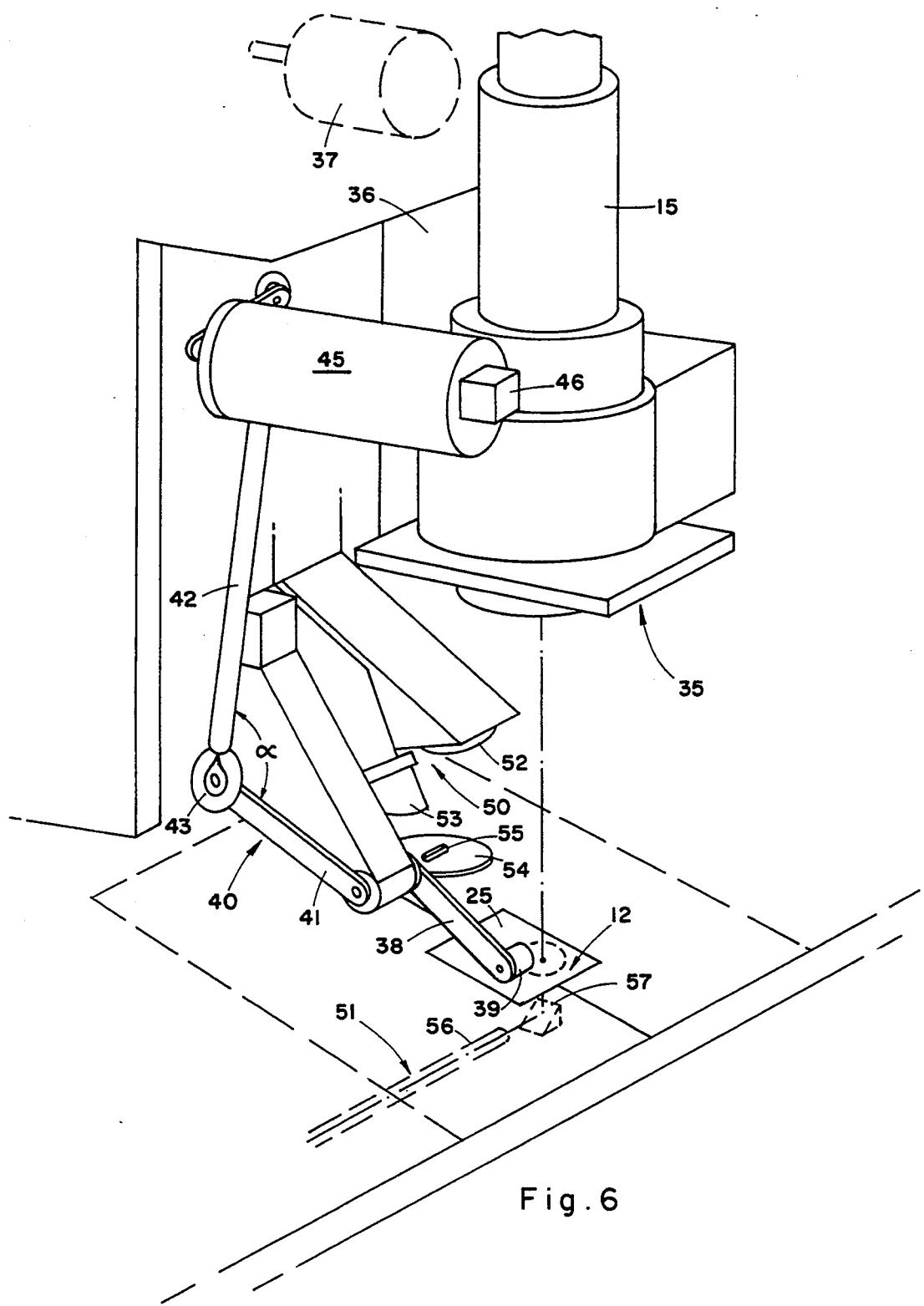
FIG. 6 is a pictorial representation of an optical system for use in the system shown in FIGS. 1 and 2.

FIG. 6 shows a detail of an optical system designated generally as 35 for use with the verification and repair station 10 shown in FIGS. 1 and 2. The optical system 35 is mounted on a support assembly shown as 36 and comprises the camera 15 which is adapted for vertical to and fro movement until the area of the PCB 12 within the window 25 is brought into sharp focus. Such movement is controlled by a focusing motor depicted as 37 coupled to the support assembly 36 so as to produce the desired vertical movement thereof, either up or down, until the area of the PCB 12 within the operating window 25 is in sharp focus. In order for this to operate effectively, the optical system 35 is pre-calibrated, the PCB 12 being focused manually whereupon the height from the PCB 12 to the camera 15 must be maintained fixed in order to ensure constant focus as successive points on the PCB 12 are brought into alignment with the camera 15.

In practice, the height from the camera 15 to the upper surface of the PCB 12 fluctuates owing to minor surface irregularities in the PCB 12 and, particularly, to buckling thereof. The focusing motor 37 is sensitive to any change in the height between the camera 15 and the PCB 12 thus produced in order to move the camera 15 either up or down until its height from the PCB 12 corresponds to the calibration height.

Furthermore, owing to slight buckling of the upper surface of the PCB 12, it can happen that although the PCB 12 is nominally in focus, in fact only the center of the imaged area of the PCB 12 is actually in focus: the peripheral edges thereof being blurred. This problem is particularly acute owing to the very high magnification employed which results in the optical system having a very limited depth of field.

In order to counteract this, a feeler arm 38 having a roller 39 pivotally fixed to an end thereof is mechanically linked to the camera 15 so as to bear on the upper surface of the PCB 12 within the operating window 25, thereby flattening slightly the upper surface of the PCB 12 and ensuring more uniform focus of the imaged area. The feeler arm 38 is coupled to the camera 15 by means of a mechanical linkage shown generally as 40 and comprising a pair of mechanical links 41 and 42 pivotally connected to one another at adjoining ends 43 thereof and forming a variable angle $\alpha$ to each other. A free end of the mechanical linkage 40 is coupled to an auxiliary motor 45 whose shaft is mechanically coupled to a rotary encoder 46 which produces an error signal which is fed back to the focusing motor 37. The whole arrangement is such that when the camera 15 is moved vertically by the focusing motor 37, so too the mechanical linkage 40 is raised or lowered, accordingly, thereby varying the angle $\alpha$ and, at the same time, rotating the shaft (not shown) of the rotary encoder 46.

By this means, the reading of the rotary encoder 46 bears a direct relationship to the angle $\alpha$ which, in turn, is a measure of the pressure applied by the roller 39 to the tipper surface of the PCB 12.

In use, the system is calibrated by manually focusing the upper surface of the PCB 12, the roller 39 attached to the feeler arm 38 bearing down slightly on the PCB 12 so that the whole of the imaged area displayed on the display monitor 17 is in sharp focus. It will be appreciated that sharp focus may, and generally will, occur without the surface of the PCB 12 lying flat against the surface of the worktable 13 owing to the likely presence of small "valleys" within the surface of the PCB 12 outside the boundary of the operating window 25. Were this not the case, then merely applying uncompensated pressure to the surface of the PCB 12 within the operating window 25 would always ensure precise focus once the system had been calibrated without requiring the need of a servo-controlled auto-focusing system. However, buckling of the PCB 12 either in an upwards or downwards direction militates against such a simple solution and demands that the optical system be refocused in respect of each imaged area.

Once the calibration has been completed, the angle $\alpha$ is stored within the computer 20, such that subsequent deviations from the stored value of the angle a constitute a measure as to whether the feeler arm 38 is applying either less or greater pressure on the upper surface of the PCB 12. Such deviations will also manifest themselves as rotations of the auxiliary motor 45 and thus as variations in the reading of the rotary encoder 46 which produces a corresponding error signal for rotating the focusing motor 37 in a counteracting direction until the angle between the links 41 and 42 of the mechanical linkage 40 is again equal to $\alpha$.

Figure 8:
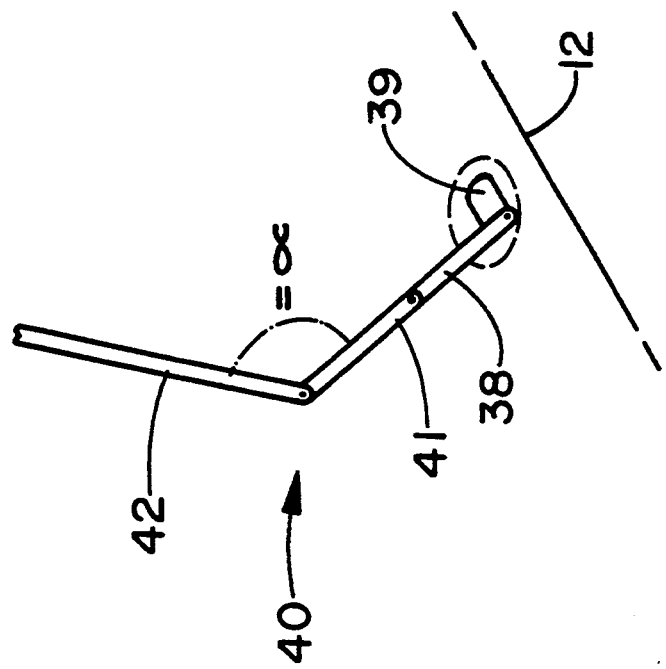
FIGS. 7 and 8 are schematic representations useful in explaining an auto-focusing optical system for use with the invention.
Figure 7:
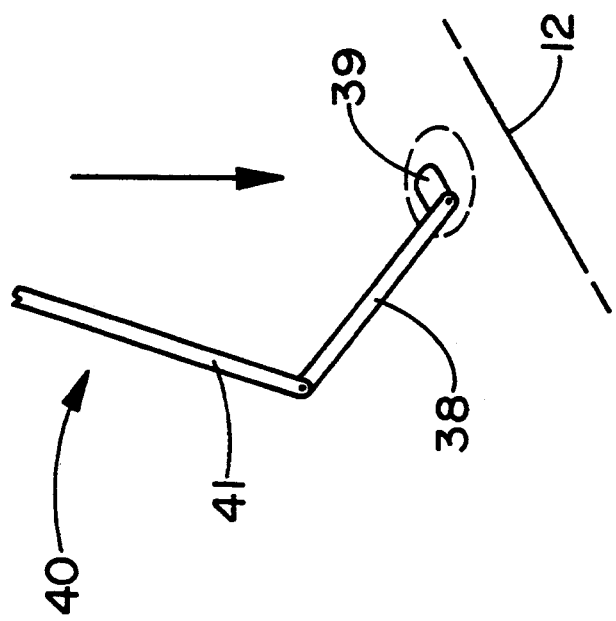

FIGS. 7 and 8 show the operation of the auto-focusing system schematically. Thus, in FIG. 7 the auxiliary motor 45 opens the mechanical linkage 40 until the roller 39 just begins to make contact with the PCB 12. Still further rotation of the auxiliary motor 45 applies pressure to the upper surface of the PCB 12 thereby flattening it within the area of the operating window 25. Any deviation between the angle between the two links 41 and 42 is registered by the rotary encoder 46 which feeds back an appropriate error signal to the focusing motor 37. The support platform 36 is now raised or lowered by the focusing motor 37, as required, until the angle between the two links 41 and 42 is exactly equal to $\alpha$ (FIG. 8) corresponding to the position of maximum focus. Since at the point of nominal focus, the roller 39 applies pressure to the upper surface of the PCB 12, thereby flattening it, the whole of the imaged area appears on the display monitor 17 in sharp focus.

Referring again to FIG. 6 of the drawings there are shown two illumination systems 50 and 51 for directing illumination to upper and lower surfaces, respectively, of the PCB 12. The illumination system 50 comprises a light source 52 for directing a spot of light on the upper surface of the PCB 12. Also provided is a prism 53 mechanically coupled to a diffuser 54 having a slit 55 therethrough and which can be moved into the path of the light beam produced by the light source 52, thereby softening the light incident on the PCB 12 and avoiding harsh reflections caused by light striking conductors thereon from reaching the camera 15.

The lower illumination source 51 comprises a source of illumination (not shown) for directing a light beam through a light guide 56 which is fixed parallel to the worktable 13 on its lower side, and a planar reflecting surface 57 disposed at an end of the light guide 56 at an angle of 45° to an axis thereof, for directing the light beam upwardly towards the worktable 13 within the area of the operating window 25.

Figure 9:
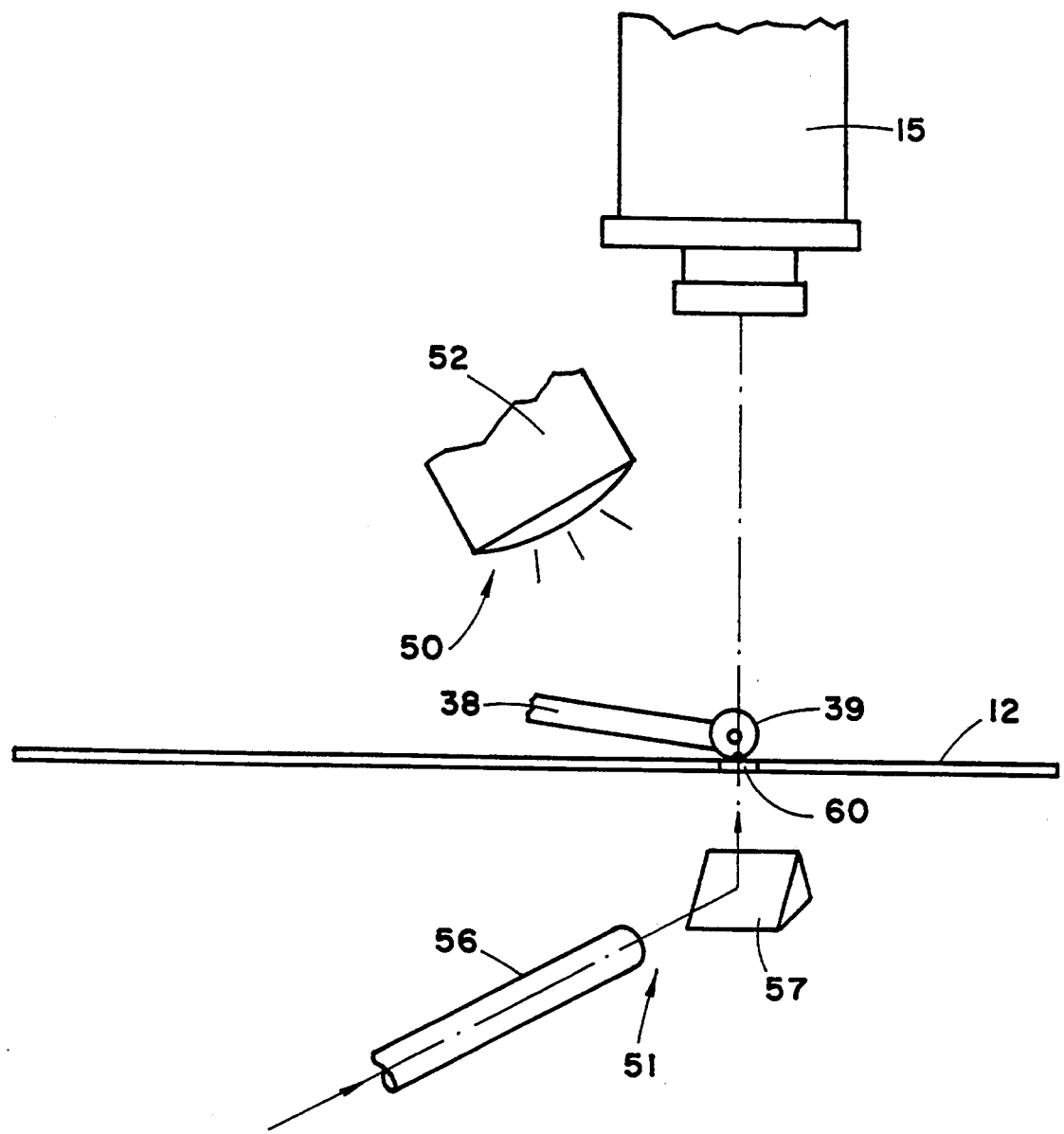
FIGS. 9, 10, 11a and 11b show schematically details of alternative optical arrangements for use with the system depicted in FIG. 1.
Figure 10:
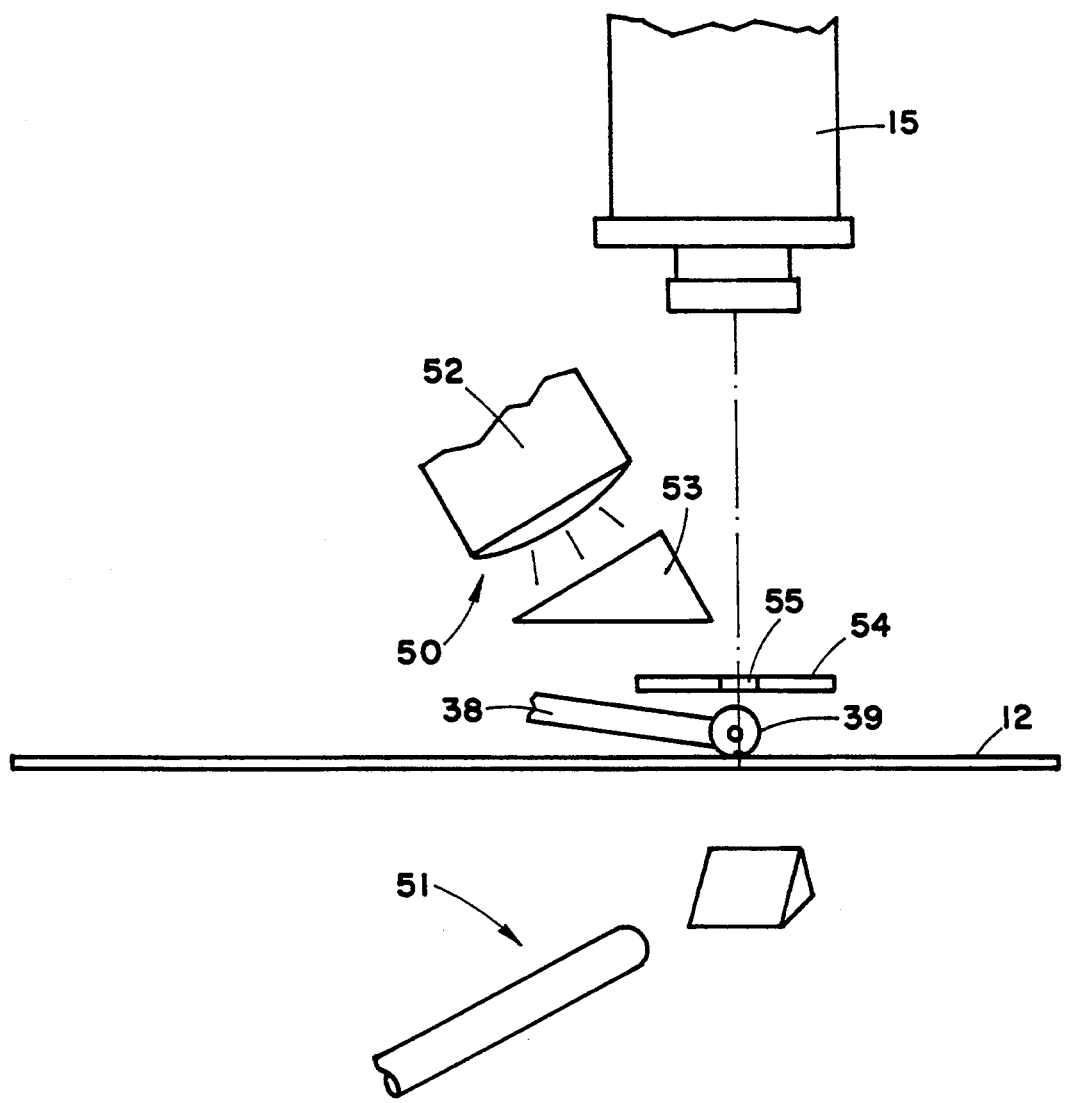

FIGS. 9 and 10 show detailed views of the illumination systems 50 and 51 for the two situations where the diffuser 54 is moved out of the light path and into the light path, respectively. Thus, the situation depicted in FIG. 9 corresponds to that described above with reference to FIG. 6 of the drawings, wherein the light source 52 directs harsh light on to the upper surface of the PCB 12 in the area within the operating window 25 (see FIG. 6) so as to be reflected by that area of the PCB 12 within the operating window 25 and in contact with the roller 39.

The worktable 13 is moved until the fault co-ordinate is exactly aligned with the camera 15, whereupon the whole of the required area within the operating window 25 is imaged by the camera 15 and appears on the display monitor 17 (see FIG. 2). A feed-through hole 60 in the PCB 12 is aligned with the light beam emitted by the lower illumination system 51 which is itself in exact alignment with the camera 15, so that light passing through the feed-through hole 60 produces an image thereof which, likewise, is displayed on the display monitor 17.

FIG. 10 shows the situation wherein the prism 53 and the diffuser 54 are moved into the path of the light beam produced by the light source 52. This causes the slit 55 within the diffuser 54 to be aligned with the camera 15 so that light scattered by the upper surface of the PCB 12 is blocked by the diffuser 54, whilst still allowing light which is reflected thereby in a substantially upwards direction to pass through the slit 55 and reach the camera 15. It will be understood that in the case where the light source 52 is employed to illuminate the upper surface of the PCB 12, the lower illumination system 51 is redundant and is not employed.

The lower illumination system 51 is employed principally for illuminating feed-through holes but is also used to illuminate transparencies such as PCB artworks, whereby better image contrast may be achieved than by illuminating from above. It should also be noted that whilst the upper illumination system 50 may be used alone, in the event that the lower illumination system 51 is required, it is used in conjunction with the upper illumination system 50.

Figure 11A:
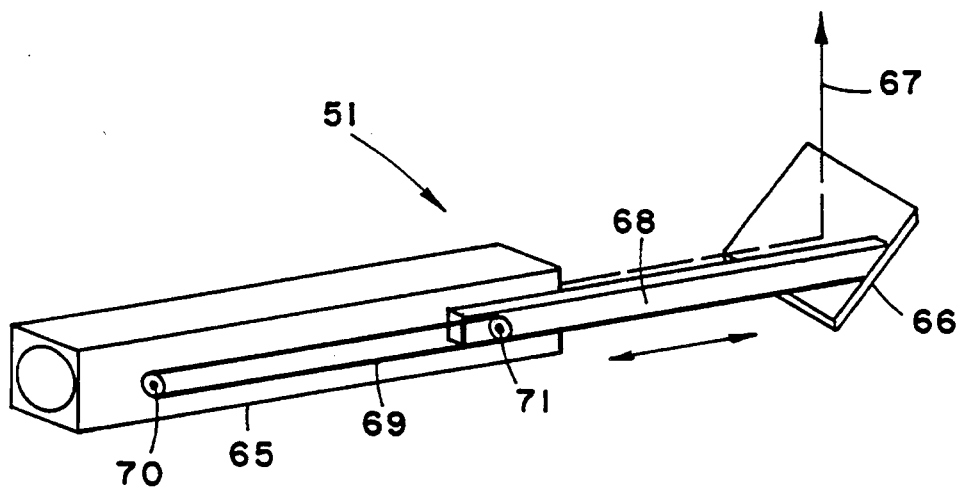
Figure 11B:
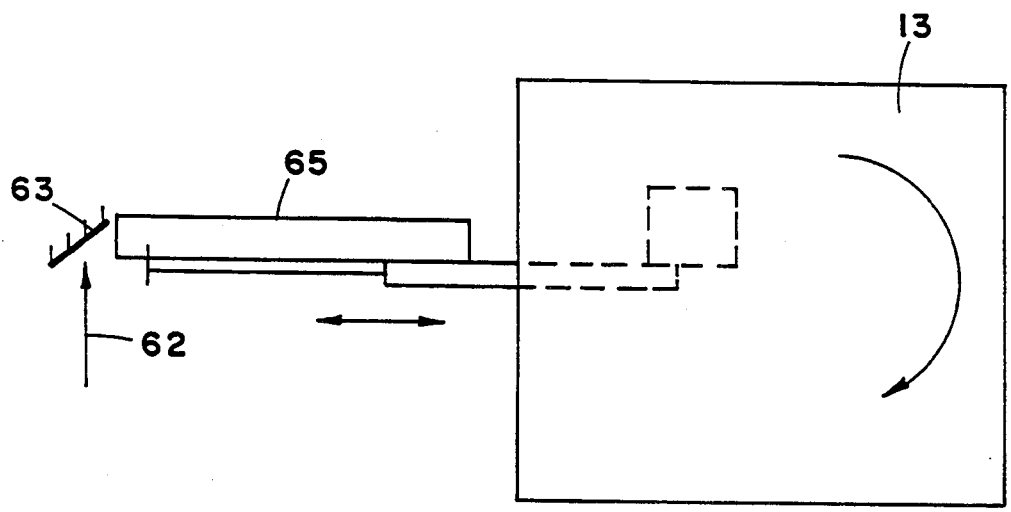

Referring now to FIGS. 11a and 11b, there are shown details of an alternative optical arrangement for the lower illumination system 51. A light source (not shown) is provided underneath the worktable 13 for producing a light beam 62 which is directed towards a 45° mirror 63 which deflects the light beam 62 through a light guide 65. A second 45° mirror 66 at an opposite end of the light guide 65 deflects the light beam upwards as a beam 67 towards the worktable 13 in a similar manner to that described above with reference to FIGS. 9 and 10 of the drawings.

The mirror 66 is fixed to a bracket 68 which itself is slidably coupled to the light guide 65 via a belt drive shown schematically as a belt 69 rolling on two pulleys 70 and 71. The pulley 70 is driven by a motor (not shown) which is operationally coupled to the computer 20 (FIG. 1). As seen in FIG. 11b the location of the light guide 65 is outside the plane of the worktable 13 such that rotation of the worktable 13 does not obstruct the light guide 65.

In use, the bracket 68 is projected outward into an operational position wherein the mirror 66 is located underneath the operating window 25 in order to direct the beam of light 67 through a feed-through hole in the PCB 12 or through a PCB artwork aligned therewith. When it is required to rotate the worktable 13 through 180°, the bracket 68 together with the attached mirror 66 is first retracted under control of the computer 20 so as not to obstruct the worktable 13 which may therefore be rotated without fouling the lower illumination system 51. Upon complete rotation through 180° of the worktable 13, the bracket 68 together with the attached mirror 66 are again advanced (again under computer control) into their operational position.

The invention thus provides an improved verification and repair station wherein the footprint is reduced compared with hitherto proposed systems allowing the operator closer access to an imaged fault location requiring manual repair. Furthermore, an improved autofocusing optical system is provided sensitive to pressure applied to an upper surface of the printed circuit board by a feeler arm for producing correct focus whilst, at the same time, causing the feeler arm to render that area of the printed circuit board imaged by the camera substantially flat. By this means, blurred edges which would otherwise occur owing to the very limited depth of field of the optical system are substantially eliminated.

Yet a further improvement provided by the invention over hitherto proposed systems lies in the fact that, by rotating the worktable in respect of a fault located in the remote half of the worktable from the operator, it is always ensured that the distance between the operator and the fault location is minimized. This is in contrast to hitherto proposed systems which provide an improvement only in the footprint of the system.

We claim:

1. A verification and repair station for examining a printed circuit board (PCB) for enabling an operator to classify suspected faults at an examination area and to effect manual repair thereof if necessary, said verification and repair station comprising:
    a worktable having means for securing thereon the PCB in precise registration with an origin of the worktable,
    a camera for producing a magnified image of the examination area of the PCB,
    illumination means for illuminating said area of the PCB,
    a computer having logic means,
    translatory drive means coupled to the worktable and to the computer for moving the worktable under control of the computer through mutually orthogonal axes so that successive ones of said examination areas aligned with the camera,
    a visual display monitor coupled to the computer and to the camera for displaying the magnified image of said area of the PCB,
    the logic means generating a drive signal in respect of any one of said examination areas which lies in a half of the worktable remote from the operator prior to its being aligned with the camera,
    a rotary drive means coupled to the worktable and to the logic means and responsive to said drive signal for rotating the worktable through 180°, and
    resiliently-biased feeler means carried by the station and continually engaging the upper surface of the PCB adjacent to the examination area to generate an error signal corresponding to variations in thickness and buckling of the PCB, and means on the station responsive to the said error signal to continually adjust the height of the camera accordingly for maintaining the examination area in sharp focus.

2. A verification and repair station for examining a printed circuit board (PCB) at a plurality of predetermined co-ordinates thereon for enabling an operator to classify suspected faults at said predetermined co-ordinates and to effect manual repair thereof if necessary, said verification and repair station comprising:
    a worktable having means for securing thereon the PCB in precise registration with an origin of the worktable,
    a camera for producing a magnified image of an area of the PCB,
    illumination means for illuminating said area of the PCB,
    a computer having a memory for storing said predetermined co-ordinates,
    translatory drive means coupled to the worktable and to the computer for moving the worktable under control of the computer through mutually orthogonal axes so that successive ones of said predetermined co-ordinates are aligned with the camera,
    a visual display monitor coupled to the computer and to the camera for displaying the magnified image of said area of the PCB,
    logic means associated with the computer for generating a drive signal in respect of any one of said predetermined co-ordinates which lies in a half of the worktable remote from the operator prior to its being aligned with the camera, and
    a rotary drive means coupled to the worktable and to the logic means and responsive to said drive signal for rotating the worktable through 180°; wherein the camera includes an auto-focusing means,
wherein the auto-focusing means includes
- a feeler arm mechanically linked to the camera and being resiliently biased so as to exert pressure on the upper surface of the PCB in a region thereof close to the predetermined co-ordinate aligned with the camera thereby tending to flatten the upper surface of the PCB at said region, and
- a focusing motor coupled to the camera and to the feeler arm and responsive to a difference in pressure thereof from a pre-calibrated value obtained with the upper surface of the PCB in sharp focus for moving the camera vertically in a direction dependent on whether said difference is positive or negative until the pressure is equal to the pre-calibrated value.

3. The verification and repair station according to claim 2, wherein the feeler arm is coupled to a rotary encoder such that pressure exerted by the upper surface of the PCB against the feeler arm effects a corresponding rotation of the rotary encoder, whereby an output of the rotary encoder is proportional to the pressure.

4. The verification and repair station according to claim 2, wherein said pre-calibrated pressure value is obtained with a lower surface of the PCB slightly proud of an upper surface of the worktable such that the upper surface of the PCB is susceptible to further flattening by the feeler arm when in sharp focus.

5. The verification and repair station according to claim 3, wherein said pre-calibrated pressure value is obtained with a lower surface of the PCB slightly proud of an upper surface of the worktable such that the upper surface of the PCB is susceptible to further flattening by the feeler arm when in sharp focus.

6. The verification and repair station according to claim 2, wherein the illumination means includes:
- a light source for directing a light beam on to the upper surface of the PCB, and
- a diffuser for intercepting said light beam prior to its striking the PCB thereby reducing strong reflections from the PCB.

7. The verification and repair station according claim 2, wherein the illumination means includes:
- a source of light for producing a light beam, and
- a light guide underneath the worktable and having directing means for directing the light beam upwardly through the worktable towards a lower surface of the PCB.

8. The verification and repair station according to claim 7, wherein:
- the light guide is fixed parallel to the worktable and passes the light beam axially therethrough, and
- the directing means includes a planar reflecting surface set at an angle of 45° to an axis of the light guide.

9. The verification and repair station according to claim 7, wherein:
- the directing means is slidably coupled to the light guide and there are provided drive means for advancing the directing means into an operational position wherein the directing means is located at a desired location under the lower surface of the PCB, and for retracting the directing means prior to rotating the worktable through 180°.

10. The verification and repair station according to claim 2, wherein the visual display monitor stores the magnified image during movement of the worktable, so that said movement is not seen by the operator on the visual display monitor.

11. The verification and repair station according to claim 10, further including an operator-controlled return means for returning the worktable to a previously aligned co-ordinate.

* * * * *